(12) United States Patent
Infantolino et al.

(10) Patent No.: US 6,759,270 B2
(45) Date of Patent: Jul. 6, 2004

(54) SEMICONDUCTOR CHIP MODULE AND METHOD OF MANUFACTURE OF SAME

(75) Inventors: William Infantolino, Vestal, NY (US); Voya R. Markovich, Endwell, NY (US); Sanjeev B. Sathe, Binghamton, NY (US); George H. Thiel, Endicott, NY (US)

(73) Assignee: International Buisness Machines Corporation, Armonk, NY (US)

( * ) Notice: Subject to any disclaimer, the term of this patent is extended or adjusted under 35 U.S.C. 154(b) by 0 days.

(21) Appl. No.: 10/660,261

(22) Filed: Sep. 11, 2003

(65) Prior Publication Data

US 2004/0058474 A1 Mar. 25, 2004

Related U.S. Application Data

(62) Division of application No. 10/254,414, filed on Sep. 25, 2002.

(51) Int. Cl.[7] .......................... H01L 21/44; H01L 21/48; H01L 21/50
(52) U.S. Cl. ................... 438/106; 438/125; 438/126; 438/127
(58) Field of Search ................ 438/106, 125, 438/126, 127

(56) References Cited

U.S. PATENT DOCUMENTS

| | | | |
|---|---|---|---|
| 5,073,814 A | * 12/1991 | Cole et al. | 257/643 |
| 5,492,586 A | 2/1996 | Gorczyca | 156/245 |
| 5,524,339 A | * 6/1996 | Gorowitz et al. | 29/841 |
| 6,221,694 B1 | 4/2001 | Bhatt et al. | 438/122 |
| 6,229,216 B1 | 5/2001 | Ma et al. | 257/777 |
| 6,271,469 B1 | 8/2001 | Ma et al. | 174/52.4 |
| 6,274,391 B1 | * 8/2001 | Wachtler et al. | 438/6 |
| 6,312,972 B1 | 11/2001 | Blackshear | 438/106 |
| 6,323,065 B1 | * 11/2001 | Karnezos | 438/122 |
| 6,403,463 B1 | * 6/2002 | Suyama | 438/622 |
| 6,555,906 B2 | * 4/2003 | Towle et al. | 257/723 |
| 6,680,441 B2 | * 1/2004 | Kondo et al. | 174/260 |

FOREIGN PATENT DOCUMENTS

| | | |
|---|---|---|
| JP | 11220061 A | 8/1999 |

OTHER PUBLICATIONS

IBM Technical Disclosure Bulletin entitled "Flatpack Package Using Core Metal Layer of Composite Substrate as Ground Plane", Mar., 1991.

* cited by examiner

*Primary Examiner*—Nathan J. Flynn
*Assistant Examiner*—Angel Roman
(74) *Attorney, Agent, or Firm*—William N. Hogg

(57) ABSTRACT

A semiconductor chip module and forming method is provided. The module includes a support member having at least one well being open to receive a semiconductor chip. Each well depth is substantially equal to the thickness of a chip. The support member has a planar region surrounding each well. A chip is in each well. A dielectric sheet of material is laminated over each chip and extends onto the planar area surrounding the wells and has a face oriented away from the chip. Electrical circuitry including capture pads is formed on the face of the dielectric sheet and extends onto the sheet that overlies the planar region. Conducting vias are formed in the dielectric sheet connecting the electrical circuitry on the dielectric sheet with the contact pads on the chip. A multilayer, circuitized laminate having a fan-out pattern is laminated to the dielectric sheet.

8 Claims, 3 Drawing Sheets

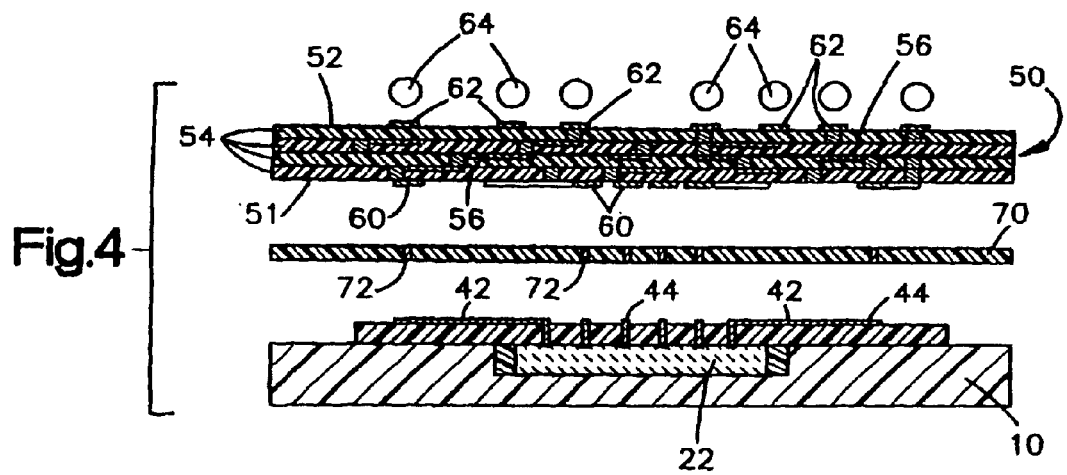
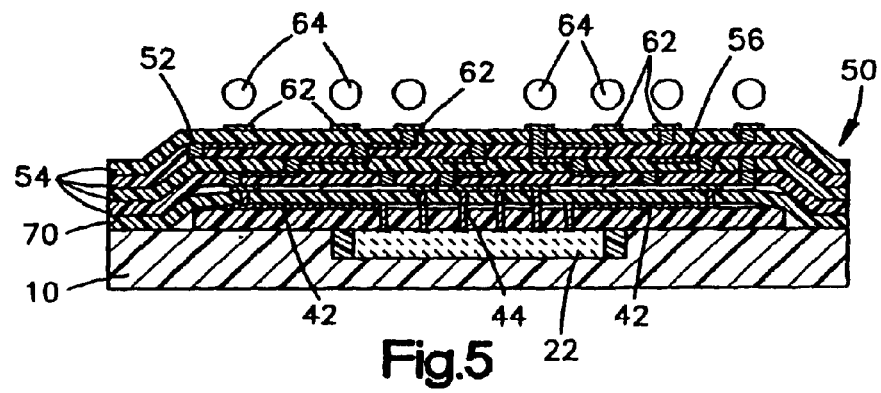
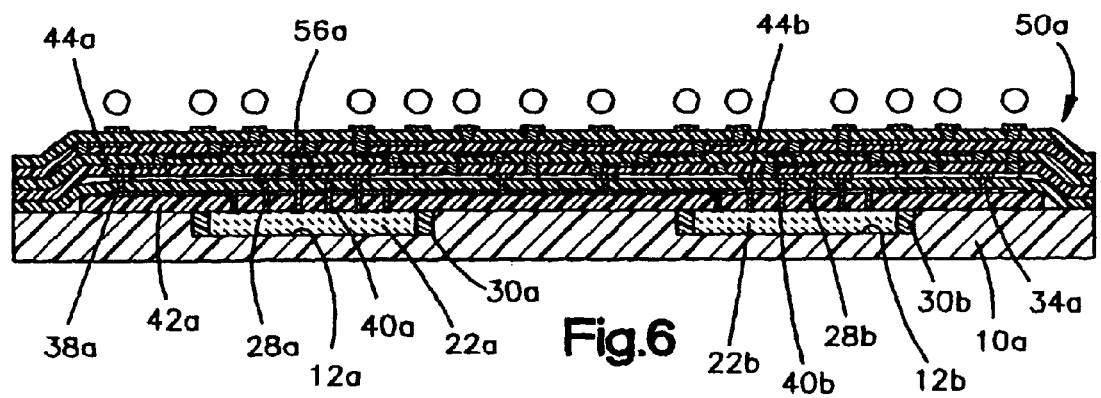

SEMICONDUCTOR CHIP MODULE AND METHOD OF MANUFACTURE OF SAME

CROSS REFERENCE TO RELATED APPLICATIONS

This application is a division of application Ser. No. 10/254,414, filed Sep. 25, 2002.

FIELD OF THE INVENTION

This invention relates generally to a structure and method of making the same for a semiconductor chip module; and, more particularly, to a structure and method for forming a semiconductor chip module which eliminates the need for C4 connections of an I/C chip to a carrier by allowing circuitry to be formed directly on a sheet laminated to the I/C chip without the necessity of having C4 connections of a chip to a carrier.

BACKGROUND OF THE INVENTION

Background Information

One conventional prior art technique of mounting integrated circuit chips to printed circuit boards involves the use of a chip carrier. In this technique, the integrated circuit chip is provided with electrical contact pads and the chip is mounted to a chip carrier by means of solder connection to the carrier directly to the chip pads known as C4 technology (control collapse chip connection). The chip carrier includes fan-out circuitry, conventionally multilayer circuitry, formed on dielectric materials and on which the chip is mounted and has ball grid array pads which are suitable for connecting a chip carrier by solderball connections to a printed circuit board. Thus, the connection of the chip to the circuit board is first through C4 connections to the chip carrier, and the chip carrier then includes a multilayer structure having output circuitry terminating in ball grid array pads which are connected by solderball connections to pads on the printed circuit board. In some cases, the chip carrier may mount more than one chip, in which case the connection of one chip to another on the same carrier, if required, can be done through the chip carrier. However, in many instances, but a single chip is mounted on a chip carrier and, in order for the chips to communicate with each other, the communication must be through the C4 joints to the fan-out circuitry on the chip carrier on which the first chip is mounted, through the ball grid array to the printed circuit board, then back to the ball grid array connected to the chip carrier to which the second chip is attached, and, thence, through the C4 joints of the second chip carrier to the second chip. Such a long path utilizing a significant amount of wiring area is one drawback to the prior art invention where multiple chips are mounted each on an individual chip carrier and must be connected to each other. Furthermore, a longer wiring path diminishes communication speed.

Another drawback to the conventional prior art C4 technology is the propensity of failure to occur at the C4 joints due to thermal mismatch and other factors. This is especially true as the technology produces finer line circuitry and more pads in a particular footprint, thus reducing the size of the C4 connections and, hence, contributing to such failure.

There have been several prior art proposals to eliminate the C4 technology type of connection, but these have suffered drawbacks in that they are relatively non-cost effective except for high end modules and/or induced stresses at certain locations, so these solutions are not viable. Thus, there is a need for a cost effective integrated circuit chip module which eliminates the necessity of C4 connections.

SUMMARY OF THE INVENTION

According to the present invention, a semiconductor chip module and method of forming the module is provided. The module includes a support member having at least one well formed therein and being open to receive a semiconductor chip. Each of the wells is of a depth substantially equal to the thickness of a semiconductor chip. The support member has a planar region surrounding each of said wells. A semiconductor chip is disposed in each well with each semiconductor chip having electrical contact pads on one side thereof oriented toward the opening of the well in which it is disposed. A dielectric sheet of material is laminated over each of the semiconductor chips extending at least partially onto the planar area surrounding the wells and having a first face oriented away from the semiconductor chip. Electrical circuitry is formed on the first face of the dielectric sheet and extends onto the sheet that overlies the planar region. The electrical circuitry has electrical capture pads thereon. Conducting vias are formed in the dielectric sheet of material connecting the electrical circuitry on the dielectric sheet of material with the contact pads on the chip. A multilayer, circuitized laminate structure is provided having contact pads on one face thereof aligned with the capture pads on the dielectric sheet, and the second circuitry on the opposite face of the circuitized laminate structure connected to a ball grid array structure. Thus, a chip mounted in a support structure is provided having fan-out circuitry from the electric contact pads on the chip to the ball grid array structure without the necessity of having C4 connections to a chip carrier.

DESCRIPTION OF THE DRAWINGS

FIG. 4 is an exploded view of the structure of FIG. 3 having a multilayer circuit laminate structure positioned for lamination thereto;

FIG. 5 is a view similar to FIG. 4 with a multilayer circuit laminate structure mounted thereon;

FIG. 6 is a sectional view of another embodiment of the present invention showing a multi-avity, multi-chip structure.

DESCRIPTION OF THE PREFERRED EMBODIMENTS

Figure 1:
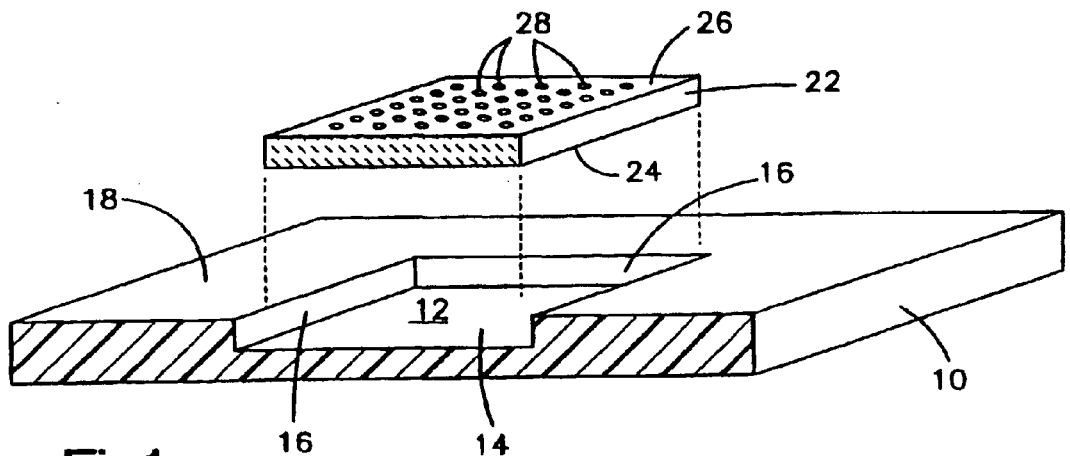
FIG. 1 is an exploded perspective view, with parts broken away for clarity, of a support structure and integrated circuit chip during the first step of construction of a module according to the present invention.
Figure 2:
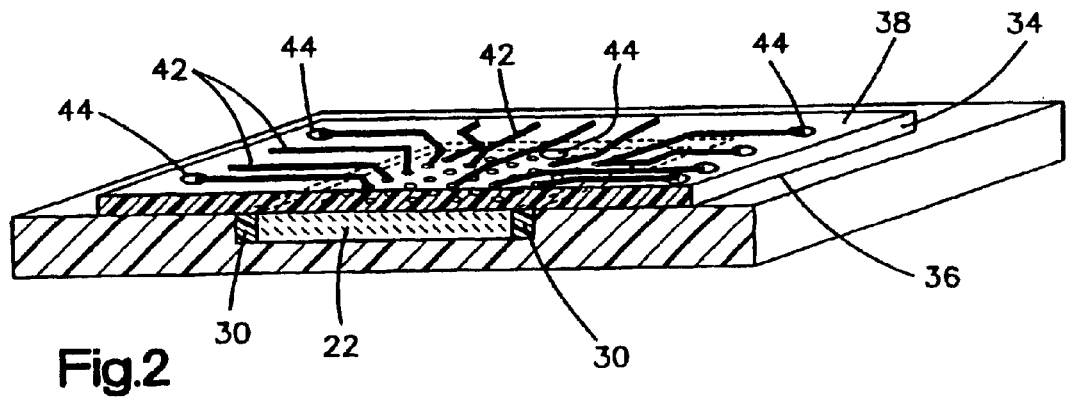
FIG. 2 is a perspective view similar to FIG. 1 of a support structure and integrated circuit chip with a sheet of dielectric material laminated thereon.
Figure 3:
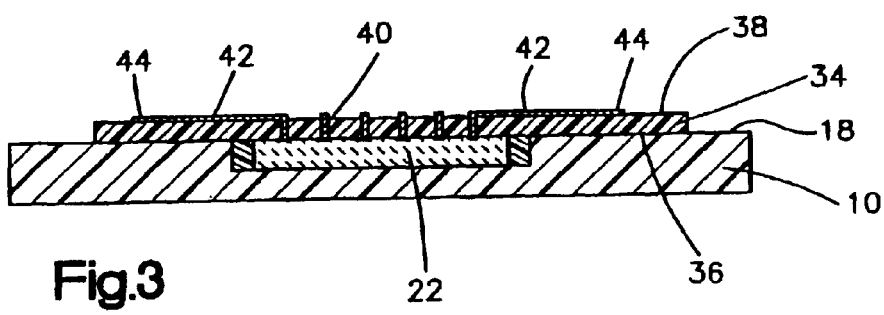
FIG. 3 is a sectional view, taken substantially on the plane designated as line 3—3 of FIG. 2, of the integrated circuit chip support and I/C chip and sheet of dielectric material having circuitry formed on the sheet of dielectric material, including vias extending therethrough.

Referring now to the drawings, and for the present to FIGS. 1–5, the various operations and sequences of the operations are shown in forming one embodiment of the integrated circuit module according to the present invention. Referring specifically to FIG. 1, a support member 10 is provided which is preferably formed of a material capable of withstanding the processing conditions of 700 degrees F. The material may be a plastic material, or metal, or ceramic. It should be fairly rigid. It does not need to be dielectric since it is isolated by a laminated dielectric material, as will be described presently. One such suitable material is alumina ceramic. A well 12 is formed in the support member 10 having a bottom wall 14, side walls 16 and a planar surface 18 surrounding the well 12. (It is to be understood that the support member 10 could be formed in two parts, a body with a through opening and a cover plate to define the wall).

As will be described presently, more than one well may be supplied to provide a multichip module. However, as shown in FIGS. 1–5, the invention will be described using but a single chip. The depth of the well 12 is substantially equal to the thickness of the integrated circuit chip which is to be inserted therein.

An integrated circuit (I/C) chip 22 is shown which has a bottom surface 24 and a top surface 26. Electrical contact pads 28 are provided on the top surface 26. The I/C chip 22 thus is a conventional integrated circuit chip of the type conventionally used to form C4 connections to a chip carrier.

The integrated circuit chip 22 is secured in the well 12 by means of an adhesive 30. As indicated above, the depth of the well 12 is approximately equal to the thickness of the integrated circuit chip 22 and, thus, the top surface 26 of the integrated circuit chip is essentially coplanar with the planar surface 18 surrounding the well 12.

A sheet of dielectric material 34 is provided which is laminated over the top surface 26 of the chip 22 and the planar surface 18 of the support member 10. The dielectric material 34 has a relatively low Young's modulus, preferably between about 10,000 psi and 1,000,000 psi, more preferably between about 20,000 psi and 100,000 psi. The thickness of the sheet of dielectric material 34 preferably is between about 10 microns and 150 microns, more preferably between about 20 microns and about 40 microns and, most preferably, about 30 microns thick. A particularly useful dielectric material is polytetrafluoroethylene (PTFE), although other organic materials, having a low Young's modulus, such as polyimide, could be used. However, the preferred material is PTFE. Since the I/C chip is not heat sensitive at this stage in the processing, a lamination process at 700° F. can be utilized to assure a good lamination of the PTFE to the I/C chip 22 and the support member 10.

The sheet of dielectric material 34 has a bottom face 36 disposed against the top surface 26 of the I/C chip 22 and the planar surface 18 of the support member 10 and is laminated securely to these surfaces. The sheet of dielectric material 34 also has a top face 38. (As used herein, "top" and "bottom" refer only to the orientation of the structure in the drawings.) Vias 40 are formed in the sheet of dielectric material 34 over and in alignment with each of the electrical contact pads 28 on the top surface 26 of the I/C chip 22. Preferably, these vias are formed by laser drilling, although other techniques may be employed. Circuitry 42 is then formed on the top surface 38 of the dielectric sheet 34 and, at the same time that the circuitry is formed, the same material is filled into the vias 40. This circuitization and forming of the vias can be accomplished by conventional plating processes, such as by masking with a photoimagable material and then imagewise exposing and developing and then plating the circuitry on the sheet 34 using conventional plating processes. Preferably, the plating is copper, although other conductors, such as aluminum, could be used. The circuitry 42 includes capture pads 44. The capture pads 44 are located both above the I/C chip 22 and above the planar surface 18, thus forming a fan-out pattern from the contact pads 28 of the I/C chip 22. The capture pads 44 are provided to connect to multilayer circuit laminate structure 50 as shown in FIGS. 4 and 5.

The multilayer laminate circuit structure 50 includes a lower face 51 and an upper face 52 and is comprised of dielectric layers 54 having circuitry 56 between the layers 54 and on the lower and upper faces 51 and 52. The multilayer circuit laminate 50 is conventional in structure, formed according to conventional prior art practices, and can be pretested before it is assembled onto the dielectric sheet 34. Preferably, the dielectric layers 54 of the laminate structure 50 are formed of the same material as the sheet of dielectric material 34. The multi-laminate structure 50 includes pads 60 on the lower face 51 and pads 62 on the upper face 52. The pads 60 are in alignment with the capture pads 44 on the face 38 of the sheet of dielectric material. The pads 62 are arranged in a ball grid array structure to accommodate solderballs 64 in a footprint which is suitable for attachment to a printed circuit board (not shown). It will be noted that the pads 60 provide additional fan-out structure from the capture pads 44, and the multilayer circuit structure 50 provides the necessary interconnection to a circuit board in a standard ball grid array (BGA) pattern utilizing conventional solderballs.

There are several techniques which can be used to secure the multilayer circuit laminate 50 to the dielectric sheet 34. One preferred technique is by the use of a sticker sheet 70 formed of a soldermask material, such as PSR4000 manufactured by Taiyko, Inc. Mfg. Co. Ltd., Japan, as shown in FIGS. 4 and 5. The sticker sheet 70 has preformed vias 72 therein to conform to the capture pads 44 on the dielectric sheet 34 and also conform to the pattern of the pads 60 on the lower face 51. Disposed in the vias 72 is a solder material which can reflow to connect the pads 44 to the pads 60. Alternatively, the vias can be filled with a conductive adhesive. Other techniques include placing the conductive adhesive or a reflow solder on the pads 44 or 60 or both. However, the preferred technique is utilizing the sticker sheet 70 with filled vias therein since this will provide a good laminate interconnection between the lower face 51 of the multilayer circuit laminate 50 and the top face 38 of the sheet of dielectric material 34. The dielectric sheet 34 on the I/C chip 22, the sticker sheet 70 and laminate circuit structure are joined by heating to form a final complete structure, as shown in FIG. 5. Thus, it can be seen that a fan-out structure is provided starting from the electrical contacts 28 on the I/C chip 22 out through the circuitry 42 on the dielectric sheet 34 and through the multilayer circuit laminate 50 to form the pads 62 for the ball grid array of the connecting solderballs 64 to a circuit board.

Referring now to FIG. 6, another embodiment of the present invention is shown wherein multiple integrated circuit chips are disposed in a single support member. In FIG. 6, the same reference characters will be used, as were used in describing the embodiment shown in FIGS. 1–5, but with letter suffixes to differentiate them. As shown in FIG. 6, a support member 10a is provided which has a plurality of wells, two of which are shown as 12a and 12b. I/C chips 22a and 22b are disposed in the wells 12a and 12b, respectively, with the chips 22a and 22b having, respectively, electrical contact pads 28a and 28b. The I/C chips 22a and 22b are held in the wells by adhesives 30a and 30b. A single dielectric sheet 34a is provided which covers both the chips 22a and 22b and circuitry 42a formed on the top face 38a of the dielectric sheet 34a. Filled vias 40a, 40b extend through sheet 31a and are in contact with the electrical contact pads 28a and 28b. The dielectric sheet 34a has capture pads 44a, 44b just as in the previous embodiment. A single, multilayer circuitized laminate structure 50a is provided which, as in the previous embodiment, aligns with the capture pads 44a, 44b and is secured to the dielectric sheet 34a as previously described. However, in this embodiment, the chips 22a and 22b can be connected through circuitry 42a on the dielectric sheet 34a as well as through the circuitry 56a. Alternatively, individual multi-layer circuit laminate structures (not shown) could be provided for each of the chips 22a and 22b while still allowing the chips to be connected through circuitry 42a.

Figure 7:
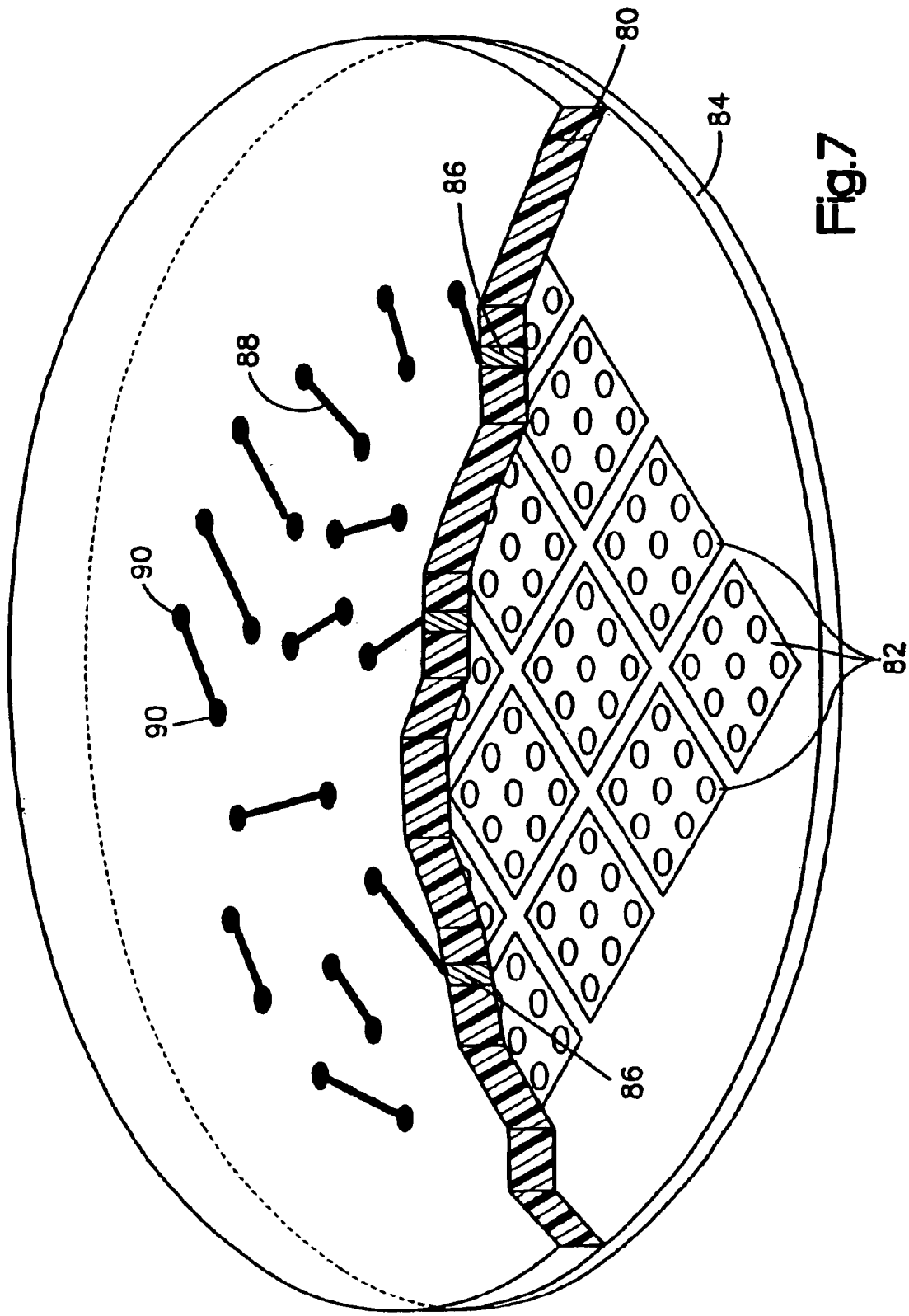
FIG. 7 is a perspective view, with parts broken away for clarity, of the present invention as applied to a wafer.

In another embodiment of the invention, shown in FIG. 7, a dielectric sheet 80 is provided which covers all of the individual chips 82 formed on a wafer 84 and is laminated to the wafer. Again, this is a low modulus dielectric material, such as PTFE or polyimide. This dielectric sheet is drilled, just as previously described, to form vias 86 and circuitry 88 with capture pads 90. However, the amount of circuitry 88 that can be provided on the wafer is limited because of the proximity of the chips. (Of course, adjacent chips 82 that are to act as a unit, such as particularly memory chips, can be connected by the circuitry 88 and diced as a unit.) This is merely the first step and when the chips are diced and separated, they are then placed into a well in a support member just as previously described; although in such case there would be the first level of pads formed thereon and a small amount of capture circuitry so that a second sheet in the form of a sticker sheet can be provided which would then supply the basis for attaching the multilayer circuit laminate.

While preferred embodiments of the invention have been described herein, variations in the design may be made, and such variations may be apparent to those skilled in the art of making like structures, as well as to those skilled in other arts. The materials identified above are by no means the only materials suitable for the manufacture of the structure, and substitute materials will be readily apparent to one skilled in the art. The scope of the invention, therefore, is only to be limited by the following claims.

What is claimed is:

1. A method of forming a semiconductor chip module comprising the steps of:

providing a support member having at least one well formed therein, each of said wells being open to receive a semiconductor chip and being of a depth substantially equal to the thickness of a semiconductor chip;

said support member having planar regions surrounding each well;

securing a semiconductor chip in each well, each of said semiconductor chips having electrical contact pads on one side thereof oriented toward the opening of said well;

laminating a dielectric sheet of organic material over each of said semiconductor chips and at least partially on said planar area, said dielectric sheet of material having a face oriented away from said semiconductor chip;

forming electrical circuitry on said first face of the dielectric sheet and extending onto the sheet overlying the planar region and having electrical capture pads thereon;

forming conducting vias connecting said circuitry on said dielectric sheet with the electrical contact pads on said chip; and connecting a multilayer, circuitized laminate structure to said face of said dielectric sheet of material, said multilayer, circuitized laminate having first circuitry on one face connected to the capture pads on said dielectric sheet and second circuitry on the opposite face connected to a ball grid array structure.

2. The invention as defined in claim 1 wherein said multilayer, circuitized laminate structure is secured to said sheet of dielectric material by a sticker sheet having openings therein corresponding to said electrical capture pads on said sheet of dielectric material.

3. The invention as defined in claim 1 wherein said openings in said sticker sheet are filled with electrical conducting material.

4. The invention as defined in claim 3 wherein said sticker sheet is a soldermask material.

5. The invention as defined in claim 2 wherein said sheet of dielectric material has a Young's modulus of between 10,000 psi and 1,000,000 psi.

6. The invention as defined in claim 1 wherein said sheet of dielectric material is PTFE.

7. The invention as defined in claim 1 wherein each said I/C chip is secured in each well with an adhesive.

8. The invention as defined in claim 1 wherein a plurality of wells are formed in said support member, and an I/C chip is secured in each well.

* * * * *